US012641734B2

(12) United States Patent
    Kimura

(10) Patent No.: US 12,641,734 B2
(45) Date of Patent: May 26, 2026

(54) ELECTRONIC DEVICE

(71) Applicant: CASIO COMPUTER CO., LTD., Tokyo (JP)

(72) Inventor: Kanako Kimura, Hamura (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 134 days.

(21) Appl. No.: 18/441,136

(22) Filed: Feb. 14, 2024

(65) Prior Publication Data

US 2024/0188230 A1     Jun. 6, 2024

Related U.S. Application Data

(63) Continuation of application No. PCT/JP2023/004588, filed on Feb. 10, 2023.

(30) Foreign Application Priority Data

Mar. 16, 2022    (JP) ................................. 2022-041402

(51) Int. Cl.
    *H05K 5/00*        (2025.01)
    *G06F 3/02*        (2006.01)
    *H01H 13/14*       (2006.01)

(52) U.S. Cl.
    CPC ......... *H05K 5/0017* (2013.01); *G06F 3/0202* (2013.01); *H01H 13/14* (2013.01)

(58) Field of Classification Search
    CPC ... H05K 5/0017; G06F 3/0202; G06F 3/0216; G06F 3/02; G06F 15/0225; H01H 13/14; H01H 13/705; H01H 13/7065; H01H 13/84
    See application file for complete search history.

(56) References Cited

U.S. PATENT DOCUMENTS

| | | | |
|---|---|---|---|
| 4,483,634 A | | 11/1984 | Frey et al. |
| 5,360,955 A | * | 11/1994 | English ................ H01H 13/705 |
| | | | 200/343 |
| 7,067,757 B1 | | 6/2006 | Chadha |

(Continued)

FOREIGN PATENT DOCUMENTS

| | | |
|---|---|---|
| JP | S5589130 U | 6/1980 |
| JP | S55089130 U | 6/1980 |

(Continued)

OTHER PUBLICATIONS

Notice of Reasons for Refusal dated Apr. 2, 2024 received in Japanese Patent Application No. JP 2023-111820.

(Continued)

*Primary Examiner* — Seung H Lee

(74) *Attorney, Agent, or Firm* — Scully, Scott, Murphy & Presser, P.C.

(57)                     ABSTRACT

According to an embodiment, an electronic device includes a plurality of operation parts arranged from a first-end side to a second-end side of a housing and each including a keytop member having an operation surface. The keytop member corresponding to a first operation part, which is one of the operation parts arranged on the first-end side, has a lower-end-to-operation-surface height greater than that of the keytop member corresponding to a second operation part, which is one of the operation parts arranged on the second-end side.

8 Claims, 7 Drawing Sheets

(56) References Cited

U.S. PATENT DOCUMENTS

| | | | |
|---|---|---|---|
| 7,671,291 | B2 | 3/2010 | Odanaka |
| 7,778,672 | B2 | 8/2010 | Imazaki et al. |
| 8,228,296 | B2 * | 7/2012 | Lee ....................... G06F 1/1626 |
| | | | 345/169 |
| 9,769,920 | B2 | 9/2017 | Ely et al. |
| 2005/0215292 | A1 | 9/2005 | Imazaki et al. |
| 2007/0114335 | A1 | 5/2007 | Odanaka |

FOREIGN PATENT DOCUMENTS

| | | | |
|---|---|---|---|
| JP | S57125069 | A | 8/1982 |
| JP | S60141035 | U | 9/1985 |
| JP | S60187431 | U | 12/1985 |
| JP | S6226717 | A | 2/1987 |
| JP | S6372011 | A | 4/1988 |
| JP | 2000207986 | A | 7/2000 |
| JP | 2002207550 | A | 7/2002 |
| JP | 2005275737 | A | 10/2005 |
| JP | 2007141707 | A | 6/2007 |
| JP | 2012174560 | A | 9/2012 |
| JP | 2012174622 | A | 9/2012 |
| JP | 2013191336 | A | 9/2013 |
| WO | 2012115125 | A1 | 8/2012 |

OTHER PUBLICATIONS

International Preliminary Report on Patentability and Written Opinion dated Sep. 26, 2024 received in International Application No. PCT/JP2023/004588.

International Search Report dated Apr. 11, 2023 issued in PCT/JP2023/004588.

JP Office Action dated Apr. 4, 2023 issued in JP 2022-041402.

Office Action dated Aug. 8, 2025 received in United Arab Emirates Patent Application No. P6000178/2004.

* cited by examiner

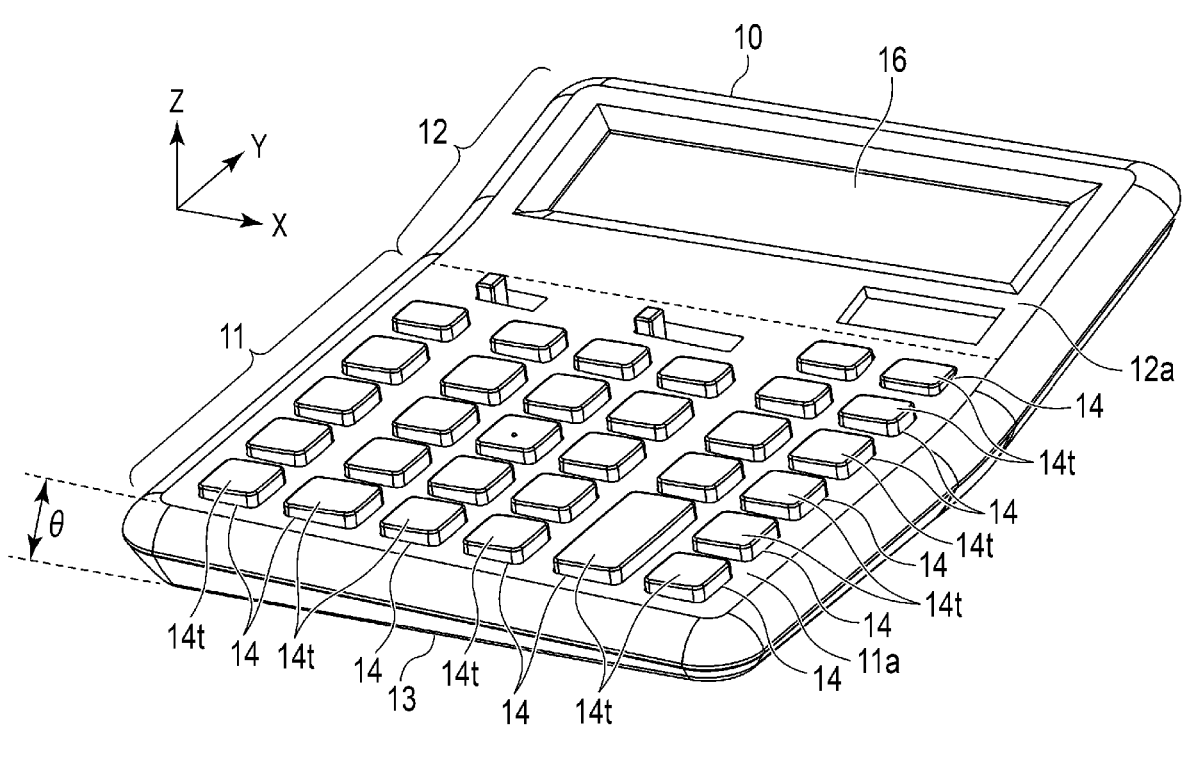
F I G. 3
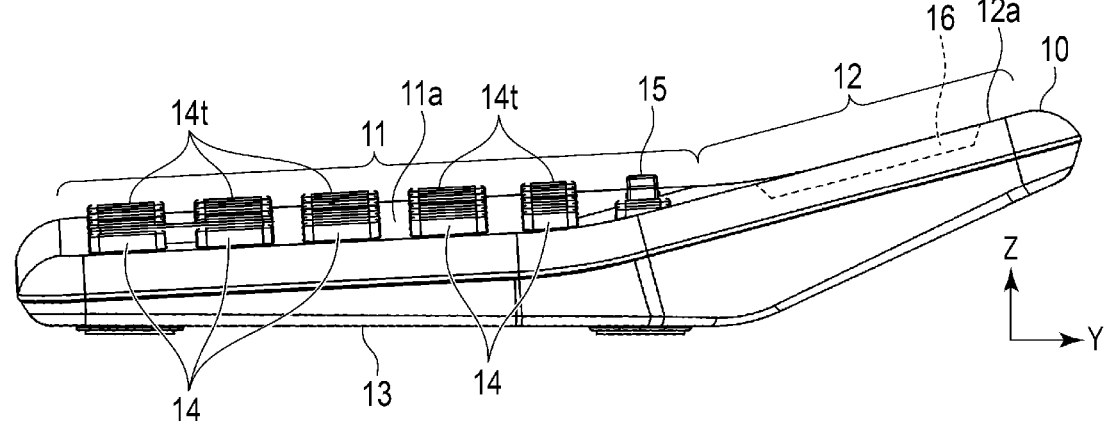
F I G. 4

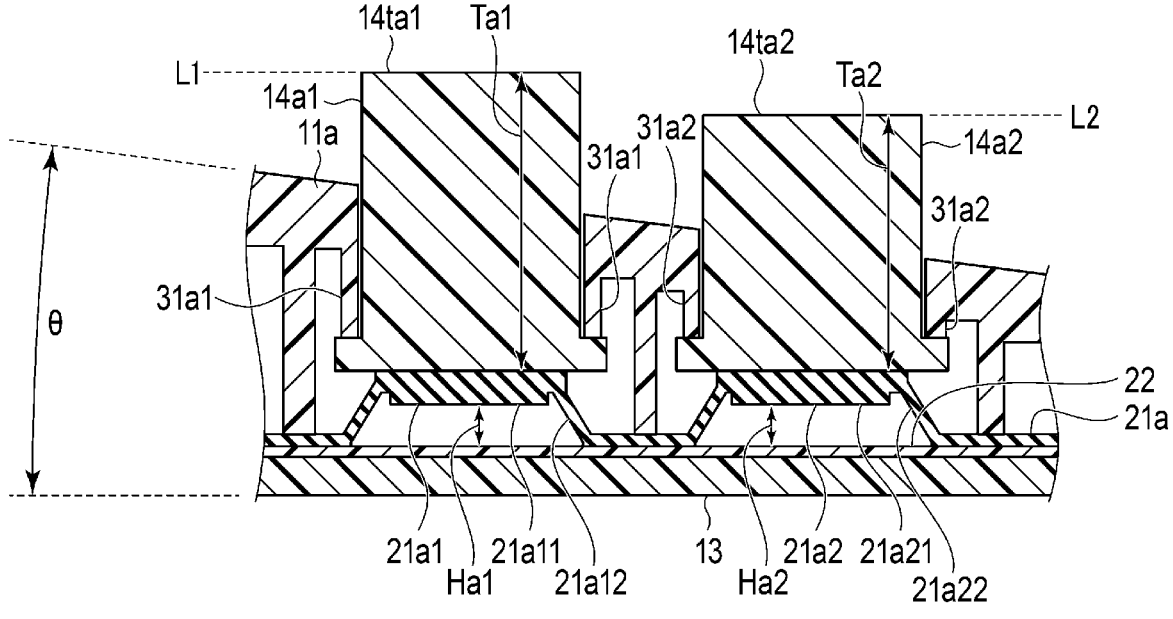
F I G. 5

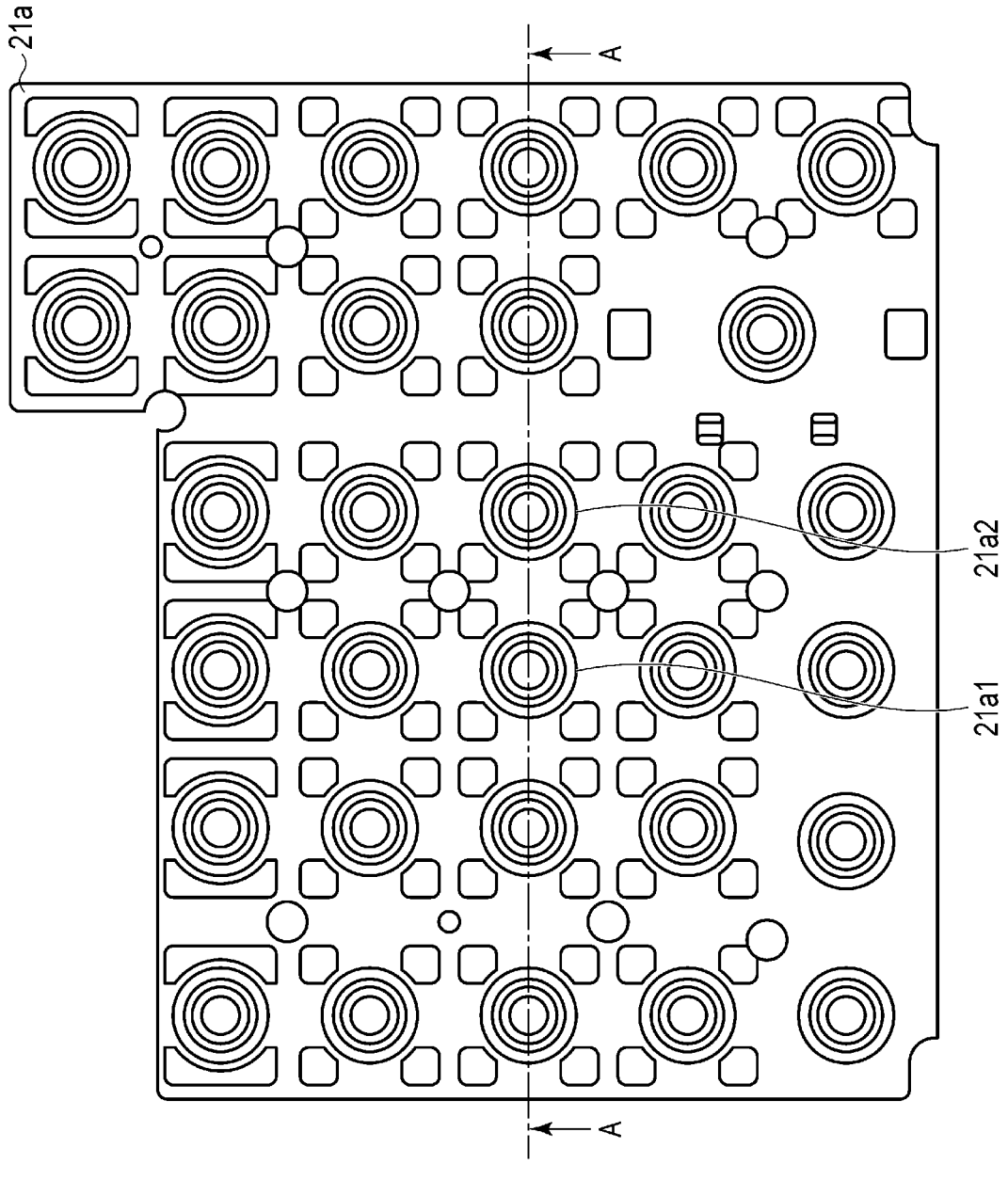
F I G . 6

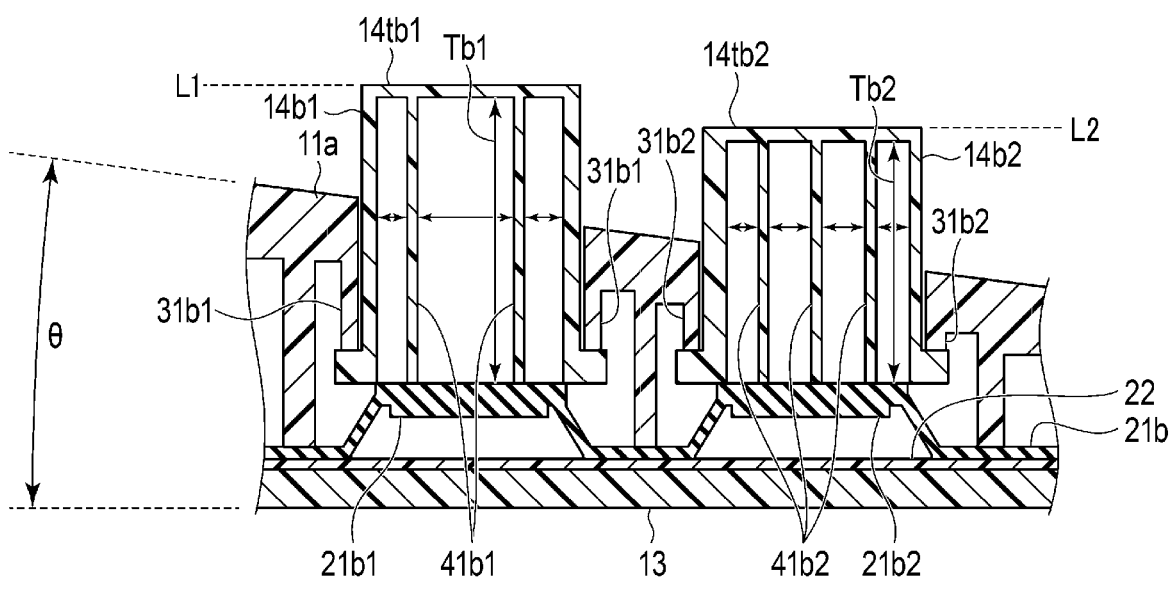
F I G. 7
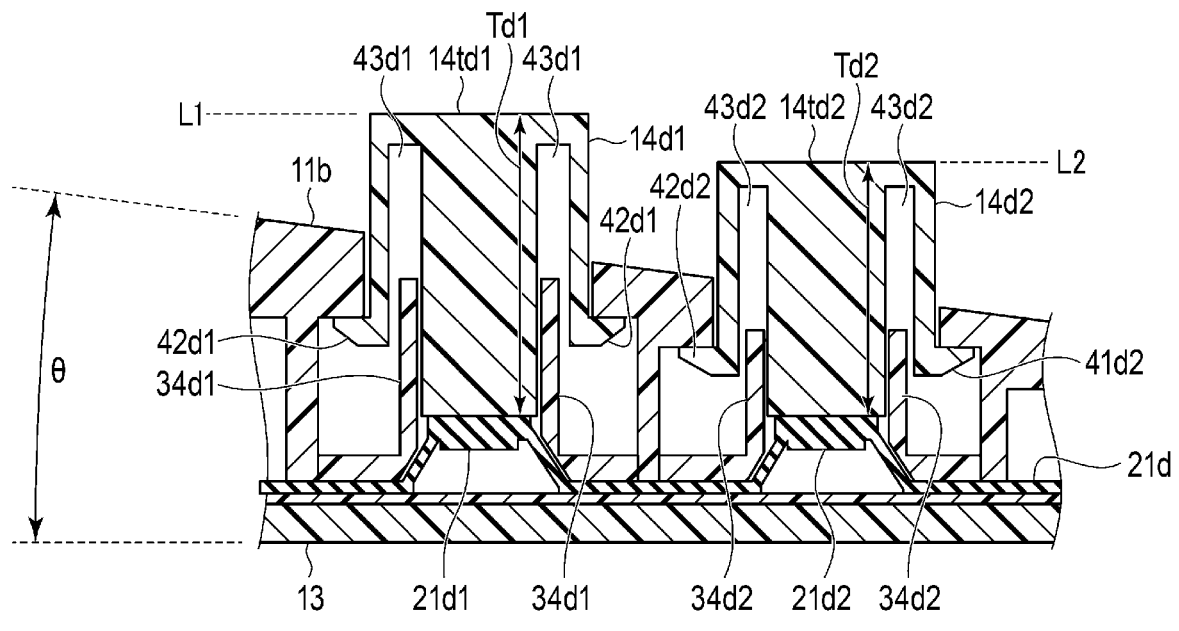
F I G. 8

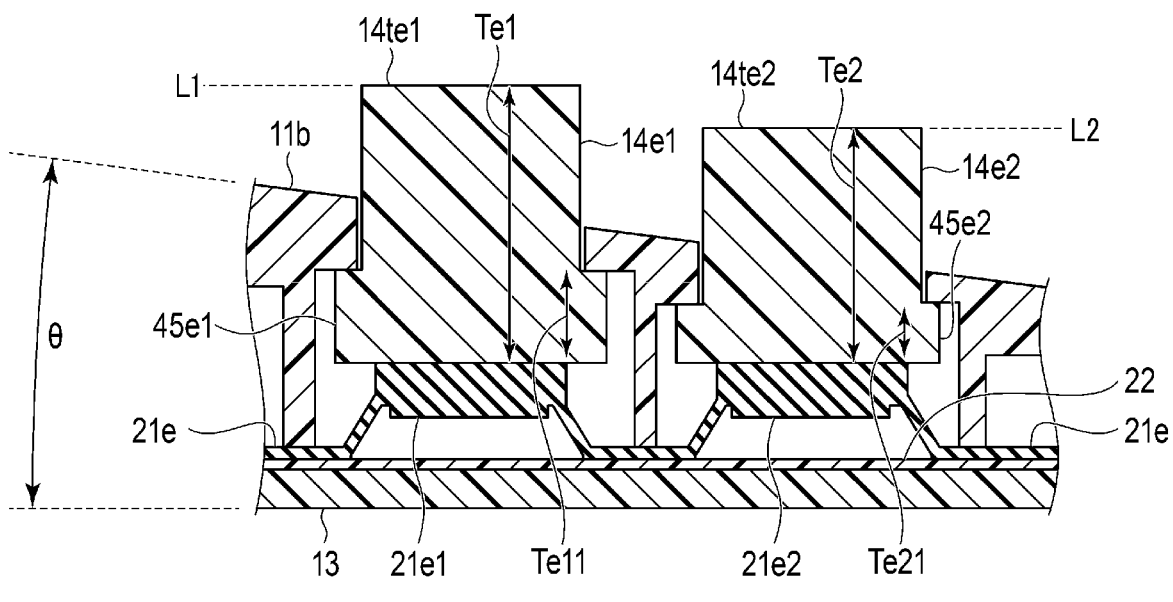
F I G. 9
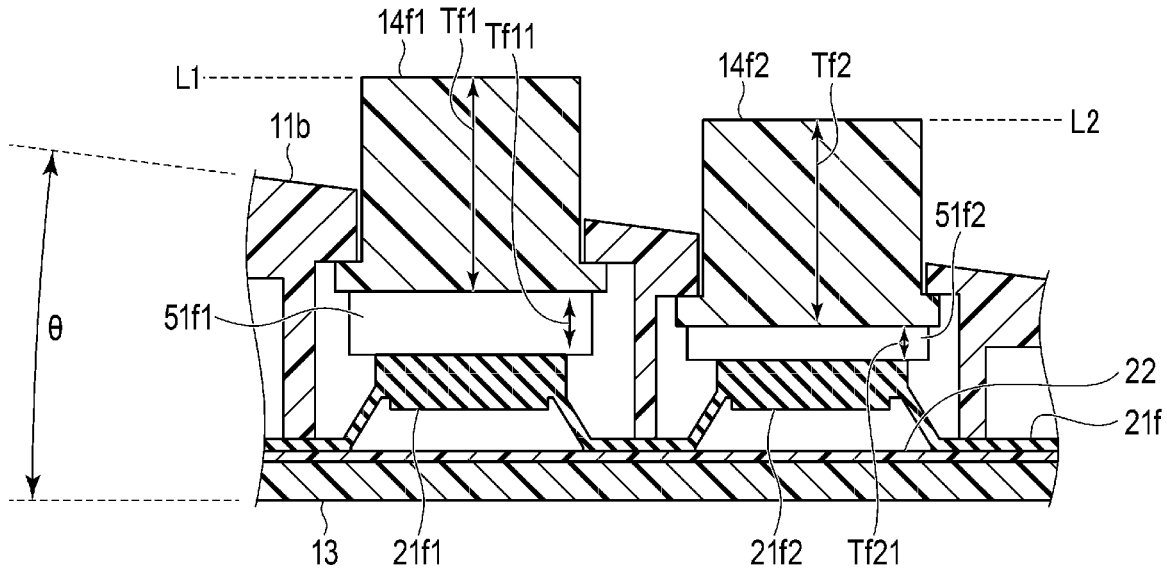
F I G. 10

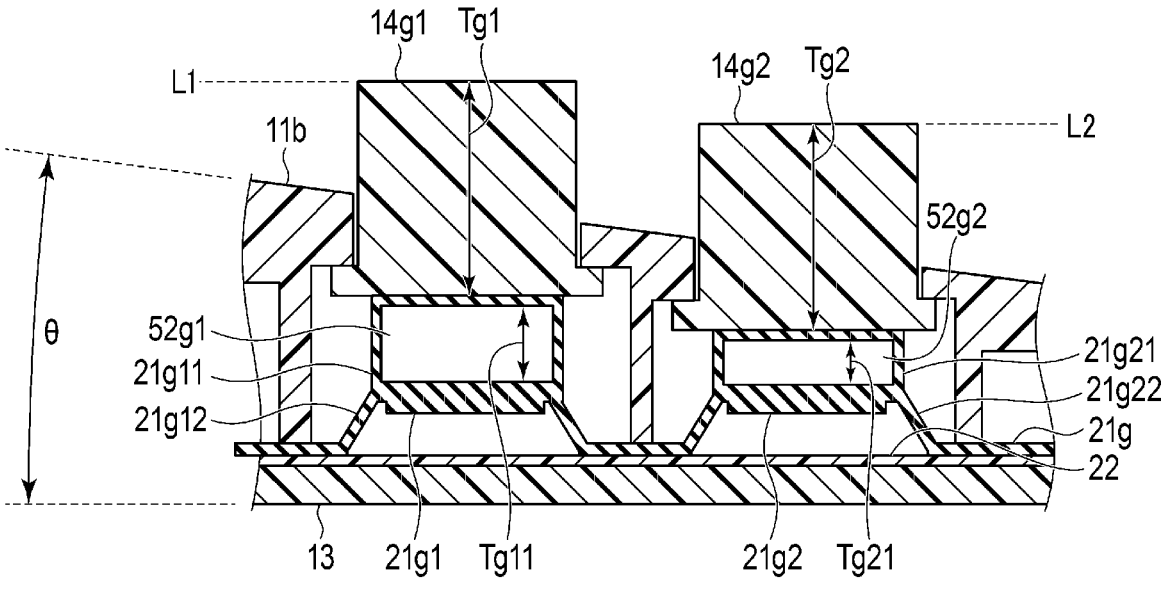
F I G. 11
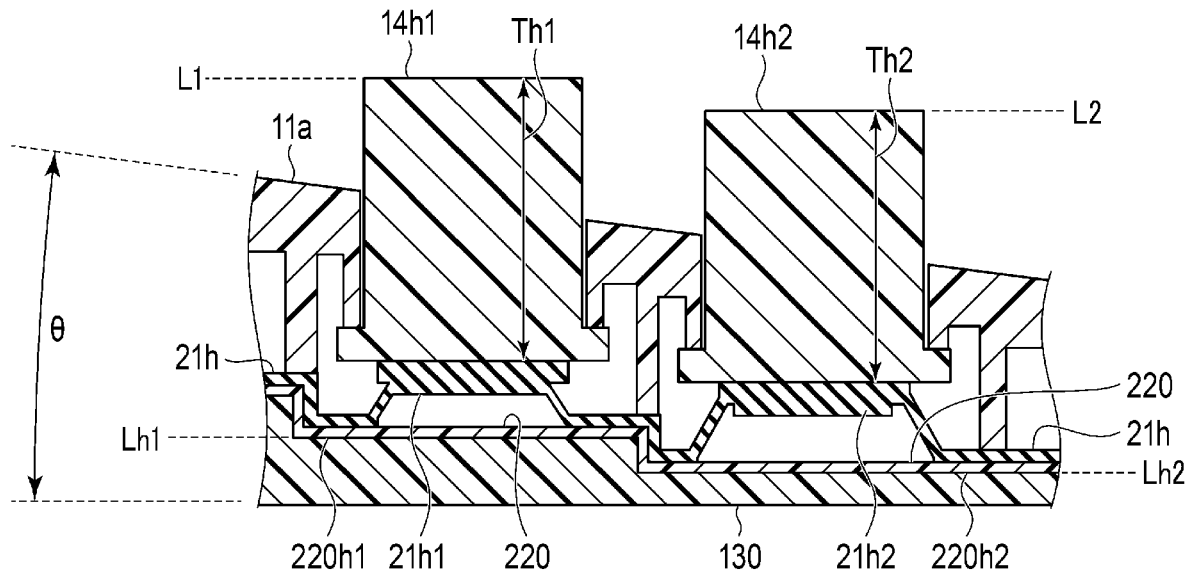
F I G. 12

ELECTRONIC DEVICE

CROSS-REFERENCE TO RELATED APPLICATIONS

This application is a Continuation Application of PCT Application No. PCT/JP2023/004588, filed Feb. 10, 2023 and based upon and claiming the benefit of priority from Japanese Patent Application No. 2022-041402, filed Mar. 16, 2022, the entire contents of which are incorporated herein by reference.

FIELD

The present invention relates to an electronic device.

BACKGROUND

Generally, an electronic device called a calculator is provided with a display and a key input section on the top of its housing. The key input section has multiple keys arranged in a matrix pattern. For example, the key input section has numeric keys, arithmetic keys, function keys, etc., each including multiple keys.

It is normally the case with a small electronic device such as a calculator that multiple keys of the key input section are operated with one hand while processing results according to inputting of keys are presented on the display and visually recognized.

The electronic device is desired to be capable of enabling accurate and quick hitting of keys of the key input section, without easily causing fatigue even from use for a long time. Conventionally, a keyboard structure with stepped keys (a step sculpture) for mitigating a physical burden is known. For example, Jpn. UM Appln. KOKAI Publication No. S60-141035 (Japanese Utility Model Application No. S59-29404, microfilm) discloses a structure with keys having a height difference in which an elastic sheet for supporting the keys (push-button switches) has a shape deformed (flexed) according to the positions of the keys. A key-to-key deformation of the key-supporting elastic sheet in this manner, however, alters the operability (a feel of a click) for each key and consequently causes a sense of discomfort in the user at key-depressing actions.

SUMMARY

An electronic device according to an embodiment includes a plurality of operation parts arranged from a first-end side to a second-end side of a housing and each including a keytop member having an operation surface. The keytop member corresponding to a first operation part, which is one of the operation parts arranged on the first-end side, has a lower-end-to-operation-surface height greater than that of the keytop member corresponding to a second operation part, which is one of the operation parts arranged on the second-end side.

BRIEF DESCRIPTION OF THE DRAWINGS

FIG. 3 is a perspective view of the electronic device according to the embodiment.

FIG. 4 is a diagram of the electronic device according to the embodiment, viewed from the right-side-surface side.

FIG. 5 is a diagram showing a first configuration example according to the embodiment, in the cross-section taken along the line A-A shown in FIG. 1.

FIG. 6 is a plan view showing an example of a rubber key according to the embodiment.

FIG. 7 is a diagram showing a second configuration example according to the embodiment, in the cross-section taken along the line A-A shown in FIG. 1.

FIG. 8 is a diagram showing a third configuration example according to the embodiment, in the cross-section taken along the line A-A shown in FIG. 1.

FIG. 9 is a diagram showing a fourth configuration example according to the embodiment, in the cross-section taken along the line A-A shown in FIG. 1.

FIG. 10 is a diagram showing a fifth configuration example according to the embodiment, in the cross-section taken along the line A-A shown in FIG. 1.

FIG. 11 is a diagram showing a sixth configuration example according to the embodiment, in the cross-section taken along the line A-A shown in FIG. 1.

FIG. 12 is a diagram showing a seventh configuration example according to the embodiment, in the cross-section taken along the line A-A shown in FIG. 1.

DETAILED DESCRIPTION

Figures 1, 2:
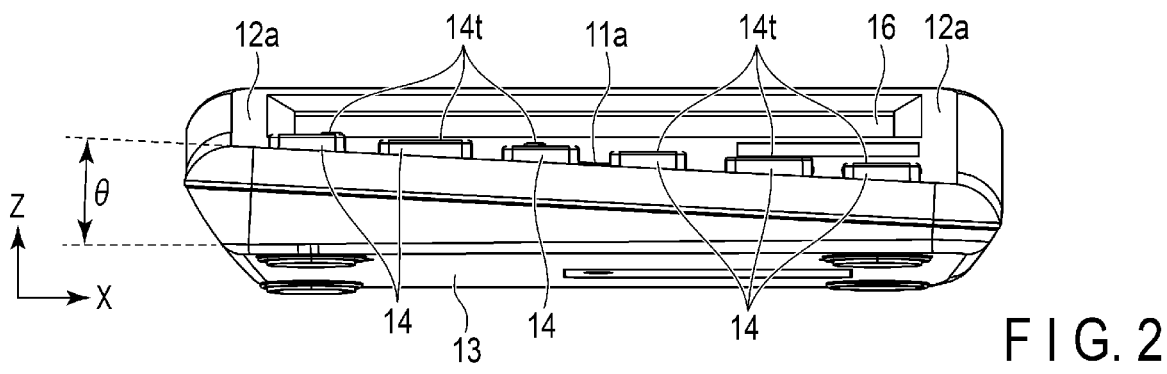
FIG. 1 is a plan view of an electronic device according to an embodiment.
FIG. 2 is a diagram of the electronic device according to the embodiment, viewed from the lower-side-surface side.

Embodiments of the present invention will be described with reference to the drawings.

FIGS. 1, 2, 3, and 4 are diagrams showing external configurations of an electronic device 10 according to an embodiment. FIG. 1 is a plan view of the electronic device 10 according to the embodiment. FIG. 2 is a diagram of the electronic device 10 according to the embodiment, viewed from the lower-side-surface side. FIG. 3 is a perspective view of the electronic device 10 according to the embodiment. FIG. 4 is a diagram of the electronic device 10 according to the embodiment, viewed from the right-side-surface side.

As shown in FIG. 1, the electronic device 10 is provided with a key input section 11 and a display section 12 on the top surface of its housing. The key input section 11 has multiple keys 14, one or more selector switches 15, and so on.

The multiple keys 14 include, for example, numeric keys, arithmetic keys, function keys, etc. The numeric keys include, for example, multiple keys corresponding to [00] and [0] to [9], respectively. The arithmetic keys include, for example, keys for use in normal calculations according to four arithmetic operations, such as keys corresponding to [+] (addition), [−] (subtraction), [×] (multiplication), [÷] (division), and [=] (execution), respectively. The function keys include, for example, an all-clear key (an [AC] key), a clear key (a [C] key), multiple memory keys ([MRC], [M-], and [M+] keys), a root key (a [√] key), and a [%] key.

The selector switch or switches 15 include, for example, a round selector and a decimal point selector.

As shown in FIG. 1, the housing top surface of the electronic device 10 is formed in a substantially rectangular outer shape. The housing top surface includes the display section 12 on an upper side (the upper-edge side of the housing top surface) and the key input section 11 on a lower side (the lower-edge side of the housing top surface).

In the display section 12, a display 16 is disposed on a first housing surface 12_a_ which is a first region (the upper side) of the housing top surface. The display 16 has, for example, a horizontally long rectangular display surface and extends from a first-end side (the left-edge side in FIG. 1) of the housing to a second-end side (the right-edge side in FIG. 1) opposite the first-end side.

In the key input section 11, multiple keys 14 (operation parts) are arranged from the first-end side to the second-end side of the housing and on a second housing surface 11a which is a second region (the lower side) of the housing top surface. The multiple keys 14 each have an operation surface 14t on their respective key tops. The multiple keys 14, in one example, are arranged at predetermined intervals (key pitches) in each of the row and column directions, with the row direction assumed to be a direction parallel to the upper edge/the lower edge of the housing top surface and the column direction assumed to be a direction parallel to the left edge/the right edge of the housing top surface.

In the electronic device 10 according to the embodiment, the second housing surface 11a of the key input section 11 is inclined in a direction from the first-end side to the second-end side, i.e., in the row direction of the arrangement of the multiple keys 14, at a first inclination angle (angle θ) with respect to the placement surface (the bottom surface of the housing). Also, the first housing surface 12a for the display section 12 is substantially in parallel (or substantially horizontal) to the placement surface (the bottom surface of the housing), or is inclined in the direction from the first-end side to the second-end side, i.e., in the row direction of the arrangement of the multiple keys 14, at a second inclination angle different from the first inclination angle (angle θ) with respect to the bottom surface of the housing.

As shown in FIGS. 2 and 4, the second housing surface 11a of the electronic device 10 is formed to be inclined in the row direction, in which the keys 14 are arranged, at the angle θ with respect to the bottom surface 13 of the housing. As an example, it is preferred that the angle θ be in a range of 1° to 9°. It is further preferred that the angle θ be in a range of, for example, 1° to 3° (this will be described in more detail later).

FIGS. 1 to 4 illustrate a configuration of the electronic device 10 which is an example where the second housing surface 11a of the key input section 11 has a rightward inclination (the left-edge side is higher than the right-edge side) as depicted in FIGS. 2 and 4. In other words, at least a portion of the operation surface 14t of the key 14 (a first operation part) on the first-end side (the left-edge side) is formed to have a greater height from the placement surface (the bottom surface of the housing) than that of at least a portion of the operation surface 14t of the key 14 (a second operation part) on the second-end side (the right-edge side). For example, the central portion (a first central portion) of the operation surface 14t of the key 14 arranged on the first-end side has a greater height from the placement surface (the bottom surface of the housing) than that of the central portion (a second central portion) of the operation surface 14t of the key 14 arranged on the second-end side.

This realizes good operability with the multiple keys 14 and prevents the user from being easily fatigued in the instances where the user operates the electronic device 10 with the right hand (the user is a right-handed user).

Note that, assuming that the user operates the electronic device 10 with the left hand (the user is a left-handed user), it is also possible to adopt a configuration in which the second housing surface 11a of the key input section 11 has a leftward inclination. In other words, at least a portion of the operation surface 14t of the key 14 on the second-end side (the right-edge side) is formed to have a greater height from the placement surface (the bottom surface of the housing) than that of at least a portion of the operation surface 14t of the key 14 on the first-end side (the left-edge side).

On the other hand, the display surface of the display section 12 is formed such that its portion on the first-end side has a height from the placement surface (the bottom surface of the housing) not greater than that of its portion on the second-end side. In the example shown in FIGS. 2 and 4, the first-end portion (the left-edge portion) and the second-end portion (the right-edge portion) of the display section 12 are aligned at the same height, and the upper-edge side of the housing top surface is raised from the boundary between the key input section 11 and the display section 12, so that the inclination in the column direction (the front-and-back direction) of the arrangement of the multiple keys 14 is formed.

As shown in FIG. 4, the housing of the electronic device 10 is bent at the boundary between the key input section 11 and the display section 12 so that the upper-edge side of the housing top surface is positioned higher. Accordingly, the first housing surface 12a of the display section 12 is inclined in the column direction in which the multiple keys 14 are arranged, thereby enhancing viewability of the display surface of the display 16.

Next, some examples of the configuration of the multiple keys 14 (operation parts) according to the embodiment will be described (as first to seventh configuration examples) with reference to FIGS. 5 to 12.

(1) First Configuration Example

FIG. 5 is a diagram showing an exemplary cross-section taken along the line A-A shown in FIG. 1. FIG. 5 only shows, among the multiple keys 14 arranged along the line A-A, two consecutively arranged keys 14. Illustrations in FIGS. 7 to 12 are given in a similar manner.

Note that illustrations in FIGS. 5 and 7 to 12 discussed below involve deformations for facilitating the understanding of the configuration of the multiple keys 14 provided for the electronic device 10, and as such, they may not perfectly conform to the configurations shown in FIGS. 1 to 4.

According to the first configuration example as shown in FIG. 5, a substrate 22 is provided at the bottom portion inside the housing of the electronic device 10, in a state parallel to the bottom surface 13 of the housing. The substrate 22 supports, inside the housing, the multiple keys 14.

The keys 14 are constituted by, for example, a rubber key 21a, and key tops 14al and 14a2 (keytop members). The key tops 14al and 14a2 (the keytop members) are formed of, for example, a resin. The rubber key 21a is placed on the upper surface of the substrate 22. The rubber key 21a is formed of, for example, an elastic material such as rubber. The rubber key 21a includes dome-shaped rubber key tops 21al and 21a2 (rubber members) formed at positions corresponding to the respective key tops 14al and 14a2 of the multiple keys 14.

The rubber key tops 21a1 and 21a2 are constituted by respective attachment portions 21a11 and 21a21 to which the lower ends of the key tops 14al and 14a2 are attached, and respective support portions 21a12 and 21a22 which support the attachment portions 21a11 and 21a21 in a state separated from the substrate 22.

The attachment portions 21a11 and 21a21 are supported by the support portions 21a12 and 21a22 so that they are normally separated from the substrate 22 but are pressed downward until they contact the substrate 22 at the time of a depressing action, in order to provide operability in response to a depressing action on the key tops 14*al* and 14*a*2 attached on the respective attachment portions 21*a*11 and 21*a*21.

The rubber key tops 21*al* and 21*a*2 are standardized for providing the same operability (feel of a click) at depressing actions on the key tops 14*al* and 14*a*2. In other words, the rubber key tops 21*al* and 21*a*2 are formed from the same material (constituent), the same shape, and the same size to substantially equal each other in mass, etc.

As used herein, a "feel of a click" refers to a sense taken by the user upon recognizing a repulsion (an elastic force) produced by the rubber key top 21*al* or 21*a*2 squashed by the user's depressing action on the key top 14*al* or 14*a*2.

FIG. 6 is a plan view showing an example of the rubber key 21*a* according to the embodiment.

As shown in FIG. 6, the rubber key 21*a* has multiple rubber key tops at positions coinciding with the multiple keys 14 arranged on the second housing surface 11*a* of the key input section 11 shown in FIG. 1. In FIG. 6, the rubber key tops 21*a*1 and 21*a*2, to which the respective key tops 14*al* and 14*a*2 of the two keys arranged along the line A-A are attached, are included.

To the rubber key tops 21*al* and 21*a*2, the respectively corresponding key tops 14*al* and 14*a*2 are attached via the attachment portions 21*a*11 and 21*a*21 so that their key stroke directions (sliding directions) are made perpendicular to the bottom surface 13 of the housing (the placement surface of the housing).

The rubber key tops 21*al* and 21*a*2 (the attachment portions 21*a*11 and 21*a*21) are each provided with a conductive member at their bottoms so that the rubber key tops 21*a*1 and 21*a*2 pressed downward by the depressing action on the key tops 14*a*1 and 14*a*2 will cause the conductive members to contact electrodes arranged on the substrate 22 for the detection of key depression events.

The key tops 14*a*1 and 14*a*2 are formed to have mutually different heights, each being a height from the bottom surface (the lower end) to the operation surface, according to their arrangement positions in the area from the first-end side (the key top 14*al* side) to the second-end side (the key top 14*a*2 side). In FIG. 5, the second housing surface 11*a* of the key input section 11 is inclined to the right, and as such, a height Ta1 of the key top 14*al* arranged on the first-end side, i.e., the height from its bottom surface to operation surface 14*ta*1, is greater than a height Ta2 of the key top 14*a*2 arranged on the second-end side, i.e., the height from its bottom surface to operation surface 14*ta*2.

Accordingly, the operation surfaces 14*ta*1 and 14*ta*2 are set at the same height from the inclined second housing surface 11*a* so that the heights of the operation surfaces 14*ta*1 and 14*ta*2 from the bottom surface 13 of the housing (the placement surface of the housing) show a stepped profile according to the inclination angle θ of the second housing surface 11*a*.

While FIG. 5 shows only the two key tops 14*al* and 14*a*2, the multiple key tops arranged from the first-end side to the second-end side are formed in a similar configuration to that of the key tops 14*al* and 14*a*2 so that the operation surfaces of the multiple key tops are stepped according to the inclination angle θ. Basically, a constant height difference is set between operation surfaces of the multiple consecutive key tops.

The second housing surface 11*a* (the housing top surface) has openings corresponding to the multiple keys 14, respectively. The openings are each formed in such a manner that the opening wall surface is substantially perpendicular (vertical) to the bottom surface 13 of the housing (the placement surface of the housing). The key tops 14*al* and 14*a*2 slidably pass through the corresponding openings, and their respective operation surfaces 14*ta*1 and 14*ta*2 are supported at levels higher than the second housing surface 11*a* in the normal state. As such, the side surfaces of the key tops 14*al* and 14*a*2 each extend substantially in parallel to the opening wall surface of the corresponding opening and face this corresponding opening wall surface with a slight clearance therebetween.

Also, ribs 31*a*1 and 31*a*2 (slide assisting members) are formed to extend in the sliding direction of the key tops 14*al* and 14*a*2, i.e., the direction perpendicular to the bottom surface 13 of the housing (the placement surface of the housing), from the respective openings of the second housing surface 11*a*. The side surfaces of the ribs 31*al* and 31*a*2 facing the respective key tops 14*al* and 14*a*2 each extend substantially in parallel to the corresponding key top 14*al* or 14*a*2 and face the corresponding key top 14*al* or 14*a*2 with a slight clearance therebetween. The ribs 31*al* and 31*a*2, extending in the sliding direction of the key tops 14*al* and 14*a*2 from the respective openings, can prevent the key tops 14*al* and 14*a*2 from wobbling in such a manner as to keep them within the slight clearance during their sliding movement.

The second housing surface 11*a* (the housing top surface) is inclined at the angle θ, and the attachment portions 21*a*11 and 21*a*21 have the same height (at the same level) from the bottom surface 13 of the housing. As such, the ribs 31*al* and 31*a*2 are each formed to have lengths from the back of the second housing surface 11*a* (the inner surface of the housing) to the position abutting the flanged bottom of the key top 14*al* or 14*a*2 (or to the contact position in the non-operating state) such that the length on the first-end side (the key top 14*al* side) is greater than the length on the second-end side (the key top 14*a*2 side). In other words, the ribs 31*al* and 31*a*2 have lengths varying in the sliding direction of the key tops 14*a*1 and 14*a*2 (the direction perpendicular to the bottom surface 13 of the housing) according to the heights of the key tops 14*a*1 and 14*a*2.

Therefore, with the respective ribs 31*al* and 31*a*2, the key tops 14*a*1 and 14*a*2 are prevented from wobbling.

As shown in FIG. 5, the operation surfaces 14*ta*1 and 14*ta*2 (upper surfaces) of the key tops 14*al* and 14*a*2 are each formed to be in parallel to the bottom surface 13. In other words, in instances where the electronic device 10 is placed in a horizontal site, the operation surfaces 14*ta*1 and 14*ta*2 of the key tops 14*al* and 14*a*2 are horizontal. Also, heights L1 and L2 of the respective key tops 14*al* and 14*a*2 decrease in order from the key top 14*al* on the first-end side and the key top 14*a*2 on the second-end side.

The key tops 14*al* and 14*a*2 are formed in an analogous shape with a comparable stroke length defined by the movable ranges of the rubber key tops 21*al* and 21*a*2, and therefore, the heights L1 and L2 from the bottom surface 13 show a stepped profile according to the inclination angle θ of the second housing surface 11*a* as shown in FIGS. 2 and 3.

In the electronic device 10 according to the embodiment as shown in FIGS. 2 and 4, the second housing surface 11*a* of the key input section 11 is inclined in the row direction of the keys 14 at the angle θ with respect to the bottom surface 13, and the operation surface 14*t* of the key 14 disposed on the first-end side is higher than the operation surface 14*t* of the key 14 disposed on the second-end side. This realizes good operability with the keys 14 and prevents the user from being easily fatigued.

Also, the rubber key 21*a* (the rubber key tops 21*a*1 and 21*a*2) has a standardized configuration (material/shape (mass)) for the multiple keys 14, while the key tops 14*a*1 and 14*a*2 have mutually different heights from their respective bottom surfaces to operation surfaces 14*ta*1 and 14*ta*2. This realizes reduced variations in operability while having different heights of the operation surfaces 14*ta*1 and 14*ta*2 of the key tops 14*a*1 and 14*a*2 from the bottom surface 13 of the housing.

(2) Second Configuration Example

FIG. 7 is a diagram showing an exemplary cross-section taken along the line A-A shown in FIG. 1.

The second configuration example is basically similar to the first configuration example. More specifically, keys 14 are constituted by, for example, a rubber key 21*b* and key tops 14*b*1 and 14*b*2 (keytop members). The key tops 14*b*1 and 14*b*2 (the keytop members) are formed of, for example, a resin. The rubber key 21*b* is placed on the upper surface of the substrate 22. Similar to the rubber key 21*a* described above, the rubber key 21*b* is formed of, for example, an elastic material such as rubber. The rubber key 21*b* includes dome-shaped rubber key tops 21*b*1 and 21*b*2 (rubber members) formed at positions corresponding to the respective key tops 14*b*1 and 14*b*2 of the multiple keys 14.

The rubber key tops 21*b*1 and 21*b*2 are formed in a similar configuration to that of the rubber key tops 21*al* and 21*a*2 in the first configuration example (FIG. 5). Also, the ribs 31*b*1 and 31*b*2 are formed in a similar configuration to that of the ribs 31*al* and 31*a*2 in the first configuration example (FIG. 5).

Similar to the first configuration example, the key tops 14*b*1 and 14*b*2 are formed such that a height Tb1 of the key top 14*b*1 arranged on the first-end side, i.e., the height from its bottom surface to operation surface 14*tb*1, is greater than a height Tb2 of the key top 14*b*2 arranged on the second-end side, i.e., the height from its bottom surface to operation surface 14*tb*2.

For the key tops 14*b*1 and 14*b*2 in the second configuration example, a hollowing-out amount from components is differentiated for each key. The key tops 14*b*1 and 14*b*2, as in the first configuration example, are formed to have mutually different heights, each being a height from the bottom surface to the operation surface, according to their arrangement positions in the area from the first-end side (the key top 14*b*1 side) to the second-end side (the key top 14*b*2 side), and the key top 14*b*1 on the first-end side has a greater height than the key top 14*b*2. As such, assuming that the components are not hollow, the key top 14*b*1 has a greater mass.

According to the second configuration example, a greater hollowing-out amount is adopted for components having a greater height from the bottom surface to the operation surface so that the multiple key tops arranged in the area from the first-end side to the second-end side have substantially the same mass. In the example shown in FIG. 7, as one exemplary form, the key top 14*b*1 is hollowed out with support members 41*b*1 left inside, and the key top 14*b*2 is hollowed out with more support members 41*b*2 left as compared to the key top 14*b*1.

Thus, at the same time as realizing unified operability with the multiple keys 14 by standardizing the configuration (material/shape (mass)) of the rubber key 21*b* for the multiple keys 14, the masses of the key tops themselves, i.e., the key tops 14*b*1 and 14*b*2, can be made substantially equal to each other by adjusting the hollowed-out amounts from the key tops 14*b*1 and 14*b*2. Accordingly, a burden on the rubber key 21*b* (the rubber key tops 21*b*1 and 21*b*2) is reduced and an improved durability can also be realized.

(3) Third Configuration Example

FIG. 8 is a diagram showing an exemplary cross-section taken along the line A-A shown in FIG. 1.

The third configuration example is basically similar to the first configuration example. More specifically, similar to the first configuration example, keys 14 are constituted by, for example, a rubber key 21*d*, and key tops 14*dl* and 14*d*2 (keytop members). The key tops 14*d*1 and 14*d*2 (the keytop members) are formed of, for example, a resin. The rubber key 21*d* (a rubber member) is placed on the upper surface of the substrate 22. The rubber key 21*d* is formed of, for example, an elastic material such as rubber. The rubber key 21*d* includes dome-shaped rubber key tops 21*d*1 and 21*d*2 (rubber members) formed at positions corresponding to the respective key tops 14*d*1 and 14*d*2 of the multiple keys 14.

The rubber key tops 21*dl* and 21*d*2 are formed in a similar configuration to that of the rubber key tops 21*a*1 and 21*a*2 in the first configuration example (FIG. 5). Similar to the first configuration example, the key tops 14*d*1 and 14*d*2 are formed such that a height Td1 of the key top 14*d*1 arranged on the first-end side, i.e., the height from its bottom surface to operation surface 14*td*1, is greater than a height Td2 of the key top 14*d*2 arranged on the second-end side, i.e., the height from its bottom surface to operation surface 14*td*2.

Note that the second housing surface 11*b* in the third configuration example does not have ribs, unlike in the first configuration example.

In the third configuration example, support members 34*d*1 and 34*d*2 extending in the sliding direction of the key tops 14*d*1 and 14*d*2 are formed at positions inside the respective key tops 14*d*1 and 14*d*2 of the multiple keys 14 and lateral to the respective rubber key tops 21*dl* and 21*d*2 (the rubber members). The support members 34*d*1 and 34*d*2 are, for example, formed integrally with the housing and perpendicularly to the bottom surface 13 of the housing from, for example, above the rubber key 21*d*.

The key tops 14*d*1 and 14*s*2 are provided with, at their inside, respective spaces for forming support member receivers 43*d*1 and 43*d*2 for slidably retaining the support members 34*d*1 and 34*d*2. The support member receivers 43*d*1 and 43*d*2, as one exemplary form, are each constituted by a space between the outer peripheral portion and the axial portion of the corresponding key top 14*d*1 or 14*d*2 and support the corresponding support member 34*d*1 or 34*d*2 within the space. The axial portions of the key tops 14*d*1 and 14*d*2 are each formed in, for example, a cylindrical shape, and the corresponding rubber key top 21*d*1 or 21*d*2 (the rubber member) is attached to the lower end (the bottom surface) of such a cylindrical portion.

The key tops 14*d*1 and 14*d*2 have the respective flanges 42*dl* and 42*d*2 at the lower ends of their outer peripheral portions. The outer peripheral portions of the key tops 14*d*1 and 14*d*2 are each formed to have a length from the operation surface 14*td*1 or 14*td*2 such that the flanges 42*dl* and 42*d*2 are each placed at the position abutting the back of the second housing surface 11*b* (the inner surface of the housing) (or at the contact position in the non-operating state).

The support member receivers 43*d*1 and 43*d*2 (spaces) are each formed to have, for example, the maximum length (such as a length up to the vicinity of the operation surface 14*td*1) according to the heights Td1 and Td2 of the key tops 14*d*1 and 14*d*2. The support members 34*d*1 and 34*d*2 are also each formed to have, for example, the maximum length according to the heights Td1 and Td2 of the key tops 14*d*1 and 14*d*2, within the range where the key tops 14*d*1 and 14*d*2 can slide by means of the support member receivers 43*d*1 and 43*d*2 (spaces). In other words, in the configuration shown in FIG. 8, the support member receiver 43*d*1 is longer than the support member receiver 43*d*2, and the support member 34*d*1 is longer than the support member 34*d*2.

This enables the support member receivers 43*d*1 and 43*d*2 and the support members 34*d*1 and 34*d*2 to provide the longest-possible support for the key tops 14*d*1 and 14*d*2 at their sliding movement (at the stroke caused by a depressing action). Therefore, the wobbling of the key tops 14*d*1 and 14*d*2 can be minimized.

(4) Fourth Configuration Example

FIG. 9 is a diagram showing an exemplary cross-section taken along the line A-A shown in FIG. 1.

The fourth configuration example is basically similar to the first configuration example. More specifically, similar to the first configuration example, keys 14 are constituted by, for example, a rubber key 21*e*, and key tops 14*e*1 and 14*e*2 (keytop members). The key tops 14*e*1 and 14*e*2 (the keytop members) are formed of, for example, a resin. The rubber key 21*e* is placed on the upper surface of the substrate 22. The rubber key 21*e* is formed of, for example, an elastic material such as rubber. The rubber key 21*e* includes dome-shaped rubber key tops 21*e*1 and 21*e*2 (rubber members) formed at positions corresponding to the respective key tops 14*e*1 and 14*e*2 of the multiple keys 14.

The rubber key tops 21*e*1 and 21*e*2 are formed in a similar configuration to that of the rubber key tops 21*a*1 and 21*a*2 in the first configuration example (FIG. 5).

Similar to the first configuration example, the key tops 14*e*1 and 14*e*2 are formed such that a height Te1 of the key top 14*e*1 arranged on the first-end side, i.e., the height from its bottom surface to operation surface 14*te*1, is greater than a height Te2 of the key top 14*e*2 arranged on the second-end side, i.e., the height from its bottom surface to operation surface 14*te*2.

The second housing surface 11*b* in the fourth configuration example does not have ribs, unlike in the first configuration example (and similar to the third configuration example). In the fourth configuration example, the key tops 14*e*1 and 14*e*2 have, at their respective bottom portions, flanges 45*e*1 and 45*e*2 differing in height (thickness) from each other.

More specifically, the second housing surface 11*b* (the housing top surface) is inclined at the angle θ, and accordingly, the key tops 14*e*1 and 14*e*2 have mutually different heights from their bottom surfaces to the back of the second housing surface 11*b* (the inner surface of the housing). The flanges 45*e*1 and 45*e*2 are each formed to have a thickness that is in accordance with the height of the corresponding key top 14*e*1 or 14*e*2 from the bottom surface to the back of the second housing surface 11*b* (the inner surface of the housing), such that the upper surfaces of the flanges 45*e*1 and 45*e*2 are each placed at the position facing the back of the second housing surface 11*b* (the inner surface of the housing), that is, at the position abutting the same or at the contact position in the non-operating state. As such, the flange 45*e*1 formed at the key top 14*e*1 has a height Tel1 which is greater than a height Te21 of the flange 45*e*2 formed at the key top 14*e*2 (the former is thicker than the latter).

Therefore, even without the ribs formed at the openings of the second housing surface 11*a* (the housing top surface) as in the first configuration example, the key tops 14*e*1 and 14*e*2 can be stably held via the second housing surface 11*b* so that wobbling can be suppressed.

(5) Fifth Configuration Example

The first to fourth configuration examples have assumed standardizing the configuration (material/shape (mass)) of each rubber key (the rubber key tops) for the multiple keys 14 and mutually differentiating the heights of the key tops from their bottom surfaces to operation surfaces so as to have different heights from the bottom surface 13 of the housing to the respective operation surfaces of the key tops. According to the fifth to seventh configuration examples, spacers are provided for the sake of different heights from the bottom surface 13 of the housing to the respective operation surfaces of the key tops.

FIG. 10 is a diagram showing an exemplary cross-section taken along the line A-A shown in FIG. 1.

The fifth configuration example is basically similar to the fourth configuration example. More specifically, similar to the fourth configuration example, keys 14 are constituted by, for example, a rubber key 21*f,* and key tops 14*f*1 and 14*f*2 (keytop members). The key tops 14*f*1 and 14*f*2 (the keytop members) are formed of, for example, a resin. The rubber key 21*f* is placed on the upper surface of the substrate 22. The rubber key 21*f* is formed of, for example, an elastic material such as rubber. The rubber key 21*f* includes dome-shaped rubber key tops 21*f*1 and 21*f*2 (rubber members) formed at positions corresponding to the respective key tops 14*f*1 and 14*f*2 of the multiple keys 14.

The rubber key tops 21*f*1 and 21*f*2 are formed in a similar configuration to that of the rubber key tops 21*al* and 21*a*2 in the first configuration example (FIG. 5).

In the fifth configuration example, in order for the heights L1 and L2 from the bottom surface 13 of the housing to the operation surfaces of the key tops 14*f*1 and 14*f*2 to have a stepped profile as in the first configuration example, the key tops 14*f*1 and 14*f*2 are formed by including respective spacers 51*f*1 and 51*f*2 differing in height from each other. While heights Tf1 and Tf2 of the key tops 14*f*1 and 14*f*2 excluding the spacers 51*f*1 and 51*f*2 are the same, heights Tfl1 and Tf21 of the spacers 51*f*1 and 51*f*2 are mutually differentiated according to the difference between the heights L1 and L2.

As such, the height of the key top 14*f*1 from its lower end to operation surface 14*f*1 equals Tf1+Tfl1, and the height of the key top 14*f*2 from its lower end to operation surface 14*f*2 equals Tf2+Tf21. Thus, the key top 14*f*1 arranged on the first-end side has a greater height than the key top 14*f*2 arranged on the second-end side. In other words, the lower ends of the keys 14 (operation parts) in the context of the fifth configuration example refer to the lower ends of the spacers 51*f*1 and 52*f*2.

The spacers 51*f*1 and 52*f*2, in one example, are formed of a non-elastic material such as a resin. Thus, for the action of depressing the key tops 14*f*1 and 14*f*2 to cause the bottom surfaces of the rubber key tops 21*f*1 and 21*f*2 to contact the substrate 22, no difference in operability is produced between the key tops 14*f*1 and 14*f*2.

As described above, the key tops 14*f*1 and 14*f*2 in the multiple keys 14 are formed by including the respective spacers 51*f*1 and 52*f*2 differing in height from each other. This allows for the standardization of the rubber key 21*f* and the key tops 14*f*1 and 14*f*2 while differentiating the heights from the bottom surface 13 of the housing to the respective operation surfaces of the key tops 14*f*1 and 14*f*2. Consequently, variations in operability can be suppressed while reducing the production costs of components.

Note that the fifth configuration example is applicable to the foregoing first to fourth configuration examples. That is, the key tops may be formed by including respective spacers differing in height as in the fifth configuration example, so as to provide mutually different heights of the operation surfaces.

(6) Sixth Configuration Example

FIG. 11 is a diagram showing an exemplary cross-section taken along the line A-A shown in FIG. 1.

The sixth configuration example is basically similar to the fourth configuration example. More specifically, similar to the fourth configuration example, keys 14 are constituted by, for example, a rubber key 21*g*, and key tops 14*g*1 and 14*g*2 (keytop members). The key tops 14*g*1 and 14*g*2 (the keytop members) are formed of, for example, a resin. The rubber key 21*g* is placed on the upper surface of the substrate 22. The rubber key 21*g* is formed of, for example, an elastic material such as rubber. The rubber key 21*g* includes dome-shaped rubber key tops 21*g*1 and 21*g*2 (rubber members) formed at positions corresponding to the respective key tops 14*g*1 and 14*g*2 of the multiple keys 14.

The rubber key tops 21*g*1 and 21*g*2 according to the sixth configuration example are formed such that their attachment portions 21*g*11 and 21*g*21 enclose respective spacers 52*g*1 and 52*g*2. The spacers 52*g*1 and 52*g*2 and the rubber key 21*g* are not individually formed for a subsequent bonding, etc., but the spacers 52*g*1 and 52*g*2 are enclosed at the time of molding the rubber key 21*g*.

The rubber key tops 21*g*1 and 21*g*2 are formed to have, assuming that the spacers 52*g*1 and 52*g*2 are excluded, substantially the same masses as those of the rubber key tops 21*a*l and 21*a*2 in the first configuration example (FIG. 5).

It will be assumed that the spacers 52*g*1 and 52*g*2 are included in the respective configurations of the key tops 14*g*1 and 14*g*2. In other words, the lower ends of the operation parts 14 in the context of the sixth configuration example refer to the lower ends of the spacers 52*g*1 and 52*g*2.

In the sixth configuration example, in order for the heights L1 and L2 from the bottom surface 13 of the housing to the operation surfaces of the key tops 14*g*1 and 14*g*2 to have a stepped profile as in the first configuration example, a height Tg11 of the spacer 52*g*1 and a height Tg12 of the spacer 52*g*2 are mutually differentiated according to the difference between the heights L1 and L2.

The spacers 52*g*1 and 52*g*2, in one example, are formed of a non-elastic material such as a resin, and the configuration of the rubber key 21*g* (the rubber key tops 21*g*1 and 21*g*2) is standardized except for the spacers 52*g*1 and 52*g*2. Thus, for the action of depressing the key tops 14*g*1 and 14*g*2 to cause the bottom surfaces of the rubber key tops 21*g*1 and 21*g*2 to contact the substrate 22, no difference in operability is produced between the key tops 14*g*1 and 14*g*2.

As described above, the rubber key tops 21*g*1 and 21*g*2 in the multiple keys 14 are formed by enclosing the respective spacers 52*g*1 and 52*g*2 differing in height from each other.

This allows for the standardization of the rubber key 21*g* and the key tops 14*g*1 and 14*g*2, except for the spacers 52*g*1 and 52*g*2, while differentiating the heights from the bottom surface 13 of the housing to the respective operation surfaces of the key tops 14*g*1 and 14*g*2. Consequently, variations in operability can be suppressed while reducing the production costs of components.

(7) Seventh Configuration Example

FIG. 12 is a diagram showing an exemplary cross-section taken along the line A-A shown in FIG. 1.

The seventh configuration example is basically similar to the fifth configuration example. More specifically, keys 14 are constituted by, for example, a rubber key 21*h*, and key tops 14*h*1 and 14*h*2 (keytop members). The key tops 14*h*1 and 14*h*2 (the keytop members) are formed of, for example, a resin.

In the seventh configuration example, the key tops 14*h*1 and 14*h*2 are formed such that a height Th1 of the key top 14*h*1 arranged on the first-end side, i.e., the height from its bottom surface to operation surface, and a height Th2 of the key top 14*h*2 arranged on the second-end side, i.e., the height from its bottom surface to operation surface, are substantially the same. That is, according to the seventh configuration example, not only is the configuration (material/shape (mass)) of the rubber key 21*h* (rubber key tops 21*h*1 and 21*h*2) standardized, but also the key tops 14*h*1 and 14*h*2 are standardized.

In the seventh configuration example, a substrate 220 constituted by, for example, a flexible substrate is provided at the inner bottom of the housing of the electronic device 10. The substrate 220 supports, inside the housing, the multiple keys 14.

The inner bottom of the housing is formed to have a stepped profile in the direction from the first-end side to the second-end side in harmonization with the areas where the multiple keys 14 are provided respectively. In other words, the inner bottom of the housing is formed such that its region (a first region) on the first-end side has a greater height from the housing bottom surface than its region (a second region) on the second-end side.

In the seventh configuration example, in order for the heights L1 and L2 from the bottom surface 13 of the housing to the operation surfaces of the key tops 14*h*1 and 14*h*2 to have a stepped profile as in the first configuration example, the inner bottom of the housing is stepped. The heights of the first and second regions from the bottom surface 13 of the housing are mutually differentiated according to the difference between the heights L1 and L2.

The substrate 220, constituted by a flexible substrate, is laid over the stepped inner bottom of the housing in such a manner as to conform to the shape of the inner bottom. As such, in terms of the height from the housing bottom surface to the substrate 220, a region 220*h*1 (height Lh1) on the first-end side is higher than a region 220*h*2 (height Lh2) on the second-end side (Lh1>Lh2).

The rubber key 21*h* is placed on the upper surface of the substrate 220. The rubber key 21*h* is formed of, for example, an elastic material such as rubber. The rubber key 21*h* includes dome-shaped rubber key tops 21*h*1 and 21*h*2 (rubber members) formed at positions corresponding to the respective key tops 14*h*1 and 14*h*2 of the multiple keys 14. In other words, the rubber key top 21*h*1 (the key top 14*h*1) is arranged in the region 220*h*1 (the first region) on the first-end side, and the rubber key top 21*h*2 (the key top 14*h*2)

is arranged in the region 220*h*2 (the second region) on the second-end side lower than the first region.

The rubber key tops 21*h*1 and 21*h*2 are formed in a similar configuration to that of the rubber key tops 21*a*1 and 21*a*2 in the first configuration example (FIG. 5).

As described above, the configuration of the rubber key 21*h* (the rubber key tops 21*h*1 and 21*h*2), as well as the configurations of the key tops 14*h*1 and 14*h*2, are standardized so that the variations in operability can be suppressed. Together, the inner bottom of the housing is stepped for regions where the keys 14 are arranged so that the heights from the bottom surface 13 of the housing to the respective operation surfaces of the key tops 14*h*1 and 14*h*2 can be mutually differentiated.

Note that the seventh configuration example is also implementable with the configurations of the rubber key (rubber key tops) and the key tops according to the fifth or sixth configuration example.

The present invention is not limited to the foregoing embodiments. For practical implementation, various modifications may be adopted without departing from its gist. Moreover, the foregoing embodiments involve various aspects, and appropriate combinations of the features disclosed herein shall permit various inventions to be derived. For example, one or more of the features disclosed in the embodiments may be omitted or combined. Provided that such modifications can solve the intended problem and bring the intended effects as discussed above, the modifications should each be deemed an invention.

What is claimed is:

1. An electronic device comprising:
a plurality of operation parts arranged from a first-end side to a second-end side of a housing and each including a keytop member having an operation surface,
wherein the keytop member corresponding to a first operation part, which is one of the operation parts arranged on the first-end side, has a lower-end-to-operation-surface height greater than that of the keytop member corresponding to a second operation part, which is one of the operation parts arranged on the second-end side, and
wherein the electronic device is configured:
such that:
a top surface of the housing is inclined in a direction from the first-end side to the second-end side at a predetermined inclination angle with respect to a placement surface;
the top surface of the housing includes openings through which the keytop members slidably pass in a direction perpendicular to the placement surface,
slide assisting members are formed at the openings of the top surface of the housing and each extend in a sliding direction of the corresponding keytop member, the slide assisting members each being configured to prevent the corresponding keytop member from sliding in a direction different from the sliding direction, and
the slide assisting members have lengths in the sliding direction which vary according to the heights of the keytop members corresponding to the respective first and second operation parts; or
such that:
the operation parts each further include a rubber member supporting the corresponding keytop member;

the rubber members of the first operation part and the second operation part are standardized in shape, size, and material;
in the operation parts, support members each extending in a sliding direction of the corresponding keytop member are formed at a position inside the corresponding keytop member and lateral to the corresponding rubber member, and
the support members have lengths differing from each other according to the heights of the keytop members corresponding to the respective first and second operation parts, or
such that:
a top surface of the housing is inclined in a direction from the first-end side to the second-end side at a predetermined inclination angle with respect to a placement surface;
the top surface of the housing includes openings through which the keytop members slidably pass in a direction perpendicular to the placement surface;
the keytop members corresponding to the respective first and second operation parts each include a portion facing an inner surface of the housing that corresponds to the top surface of the housing; and
the keytop members corresponding to the first and second operation parts have mutually different lengths from respective lower ends to positions facing the inner surface of the housing that corresponds to the top surface of the housing.

2. The electronic device according to claim 1, wherein a hollowing-out amount from the keytop member corresponding to the first operation part is greater than that from the keytop member corresponding to the second operation part.

3. The electronic device according to claim 1, wherein:
the keytop members each include a spacer; and
the spacer in the first operation part is thicker than the spacer in the second operation part so that the lower-end-to-operation-surface height of the keytop member corresponding to the first operation part is greater than that of the keytop member corresponding to the second operation part.

4. An electronic device comprising:
a plurality of operation parts arranged from a first-end side to a second-end side of a housing and each including a keytop member having an operation surface; and
a substrate provided with the operation parts,
wherein:
the keytop member corresponding to a first operation part, which is one of the operation parts arranged on the first-end side, has a lower-end-to-operation-surface height substantially equal to that of the keytop member corresponding to a second operation part, which is one of the operation parts arranged on the second-end side;
the first operation part is arranged in a first region of the substrate;
the second operation part is arranged in a second region of the substrate; and
the first region has a greater height from a bottom surface of the housing to the substrate than that of the second region.

5. The electronic device according to claim 4, wherein:
the operation parts each further include a rubber member supporting the corresponding keytop member; and the rubber members of the first operation part and the second operation part are standardized in shape, size, and material.

6. The electronic device according to claim 4, wherein the substrate is constituted by a flexible substrate which is bendable.

7. An electronic device comprising:

a plurality of operation parts arranged from a first-end side to a second-end side of a housing and each a keytop member having an operation surface, wherein:

the keytop member corresponding to a first operation part, which is one of the plurality of operation parts arranged on the first-end side, has a lower-end-to-operation-surface height greater than that of the keytop member corresponding to a second operation part, which is one of the plurality of operation parts arranged on the second-end side;

each one of the plurality of operation parts further includes a rubber member supporting a corresponding keytop member; and rubber members of the first operation part and the second operation part are standardized in shape, size, and material.

8. The electronic device according to claim 7, wherein a hollowing-out amount from the keytop member corresponding to the first operation part is greater than that from the keytop member corresponding to the second operation part.

\* \* \* \* \*